(12) United States Patent
Li et al.

(10) Patent No.: US 7,285,431 B2
(45) Date of Patent: Oct. 23, 2007

(54) METHOD FOR MANUFACTURING A GAN BASED LED OF A BLACK HOLE STRUCTURE

(75) Inventors: Jinmin Li, Beijing (CN); Guohong Wang, Beijing (CN); Liangchen Wang, Beijing (CN); Long Ma, Beijing (CN); Zhongchao Fan, Beijing (CN)

(73) Assignee: Institute of Semiconductors, Chinese Academy of Sciences, Beijing (CN)

( * ) Notice: Subject to any disclaimer, the term of this patent is extended or adjusted under 35 U.S.C. 154(b) by 299 days.

(21) Appl. No.: 11/167,242

(22) Filed: Jun. 27, 2005

(65) Prior Publication Data

US 2006/0068515 A1    Mar. 30, 2006

(30) Foreign Application Priority Data

Sep. 30, 2004   (CN) .................... 2004 1 0081010

(51) Int. Cl.
*H04N 7/00*   (2006.01)
(52) U.S. Cl. .................... 438/22; 257/88; 257/103; 438/23; 438/24; 438/25; 438/33; 438/35; 438/41; 438/44; 438/46; 438/107; 438/108; 438/113; 977/759
(58) Field of Classification Search .................. 438/21, 438/22, 41, 44, 107; 257/88, 103; 977/759
See application file for complete search history.

(56) References Cited

U.S. PATENT DOCUMENTS 5,998,810 A * 12/1999 Hatano et al. ............... 257/102
6,597,017 B1 * 7/2003 Seko et al. .................... 257/79
2001/0032985 A1 * 10/2001 Bhat et al. ..................... 257/88

* cited by examiner

*Primary Examiner*—Michael Lebentritt
*Assistant Examiner*—Abdulfattah Mustapha
(74) *Attorney, Agent, or Firm*—Westman, Champlin & Kelly, P.A.

(57) ABSTRACT

This invention relates to a method for manufacturing a GaN based LED of a back hole structure, and the method comprises: epitaxially growing an N type GaN layer, a multi-quantum wells emitting active region and a P type GaN layer in turn on an insulation substrate made of sapphire or other materials; etching the N type GaN layer by photoetching, and forming a P type ohmic contact electrode and an N type ohmic contact electrode; scribing the chip to divide the dies on the epitaxial chip into individual die; forming a $SiO_2$ insulation isolation layer on both sides of the silicon chip, forming a metal electrode on a face side, and forming a back hole pattern on a back side; forming a back hole; forming a bump pattern for plating on the face side of the silicon chip by thick resist photoetching; forming a layer of alloy with low melting point on the back side of the silicon chip, thus forming a base; on the back side of the base, directly attaching the base to a heat sink of a housing; bonding the die with the face side of the base through the metal bumps, leading an N electrode of the LED from the metal electrode formed on the face surface of the silicon chip, and leading a P electrode of the LED from the back side of the heat sink of the housing.

5 Claims, 2 Drawing Sheets

METHOD FOR MANUFACTURING A GAN BASED LED OF A BLACK HOLE STRUCTURE

The present application is based on and claims the benefit of Chinese patent application Serial No. 200410081010.9, filed Sep. 30, 2004, the content of which is hereby incorporated by reference in its entirety.

BACKGROUND OF THE INVENTION

1. Field of Invention

The present invention relates to a semiconductor technology, and more particularly, to a method for manufacturing gallium nitride based light emitting diodes of a back hole structure.

2. Description of Prior Art

As the breakthrough of the third generation semiconductor materials, gallium nitride, and the birth of blue, green and white light emitting diodes, a new industry revolution, an illumination revolution, is being gestated following the microelectronics revolution induced by the semiconductor technology, and the indication thereof is that semiconductor lamps will gradually replace incandescent lamps and fluorescent lamps. Semiconductor lamps use light emitting diodes (LEDs) as new light sources, and with same brightness, the power consumption of the semiconductor lamps is only 1/10 of that of normal incandescent lamps, but the lifetime is extended by 100 times. Semiconductor illumination (also referred as solid state illumination) has wide range of applications in large screen displaying, traffic signal lamps and general-purpose or special-purpose illumination fields due to the advantages of power saving, long lifetime, free of maintenance, and environmental protection. As is generally considered, the tendency of the semiconductor lamps to take place of conventional incandescent lamps and fluorescent lamps is certain, just as the transistors take place of the electronic tubes. The three magnates of the world illumination industry, GE, Philips and Osram, have cooperated with semiconductor corporations and established semiconductor illumination enterprises, and proposed to increase the emitting efficiency of semiconductor lamps by 8 times more and decrease the price by 100 times. A war to occupy the apex of new semiconductor illumination industry has broken out all over the world. US Department of Energy predicts that semiconductor lamps will replace 55% of incandescent lamps and fluorescent lamps around 2010 and 35 billion dollars can be saved in terms of power. Japan has proposed that conventional incandescent lamps will be widely replaced by semiconductor by 2006. As is forecasted, semiconductor illumination can form a big industry of 50 billion dollars only in US after 7 years.

Compared with conventional structure, a flip-chip structure can increase light output, enhance luminous intensity, improve heat dissipation, and increase operating current. The method generally used at present for manufacturing gallium nitride based LEDs using the flip-chip bonding technique is depositing insulation silicon oxide with poor heat conductivity on a silicon chip, forming metal electrodes on the silicon oxide, plating bumps and being flip-chip bonded with the die. In such structure, heat produced in the active region passes through the silicon oxide, which is a poor heat conductor, then is conducted to a heat sink through the silicon chip, and finally attached directly to the heat sink by the heat conduction glue. Although this method can partly solve the problem of heat dissipation, the thermal resistance is yet large enough to preventing a high power type LEDs from being used in the general-purpose illumination in the future.

SUMMARY OF THE INVENTION

The purpose of the present invention is to provide a method for manufacturing GaN based LEDs of a back hole structure, and by introducing the back hole technique into the silicon based microelectronics processes to this method, the silicon oxide insulation layer in the heat conducting path can be removed, and the silicon is replaced by the copper, whose heat conductivity is almost 3 times of that of the silicon, thus enabling the heat produced in the active region of the LED die to be directly conducted to the heat sink through the metal, which is an excellent heat conductor, and the whole heat dissipation path includes no poor heat conductor, thus reducing the thermal resistance as much as possible, and realizing the heat dissipation with a so-called sub-zero thermal resistance. This method not only makes the LEDs able to work at a larger operating current, but also improves the ability to work continuously for long time, enhances the performance and reliability, thus facilitating the realization of the power LED for illumination.

A method for manufacturing a GaN based LED of a back hole structure according to the present invention comprises steps of:

Step 1: epitaxially growing an N type gallium nitride (GaN) layer, a multi-quantum wells emitting active region and a P type gallium nitride layer in turn on an insulation substrate made of sapphire or other materials by a metal organic chemical vapor deposition (MOCVD) method;

Step 2: etching a designed chip pattern into the N type GaN layer by photoetching, and forming a P type ohmic contact electrode and an N type ohmic contact electrode on the P type GaN layer and N type GaN layer, respectively;

Step 3: thinning the sapphire substrate from its back side by a milling method or an ion thinning technique;

Step 4: scribing the chip to divide the dies on the epitaxial chip into individual die;

Step 5: forming a $SiO_2$ insulation isolation layer on both sides of the silicon chip by a thermal oxidation method, forming a metal electrode on a face side by evaporation or sputtering, and forming a back hole pattern on a back side by photoetching, then corroding the $SiO_2$;

Step 6: etching or corroding the silicon chip on the back side by ICP dry etching or KOH as anisotropic corrosion solution of silicon, until the $SiO_2$ insulation isolation layer on the face side being exposed; continuing the corrosion by HF as corrosion solution of silicon oxide, until the metal electrode being exposed, thus forming a back hole;

Step 7: plating copper with high heat conductivity in the back hole until the surface thereof and the surface of the back side of the silicon chip are in a plane;

Step 8: forming an electrode connected to the N electrode of the die by photoetching on the face side of the silicon chip;

Step 9: forming a bump pattern for plating on the face side of the silicon chip by thick resist photoetching, selectively plating metal bumps respectively connected to the P type ohmic contact electrode and the N type ohmic contact electrode of the die;

Step 10: forming a layer of alloy with low melting point on the back side of the silicon chip, thus forming a base;

Step 11: directly attaching the base to a heat sink of a housing by heating the alloy on the back side of the base;

Step 12: bonding the die with the face side of the base through the metal bumps by a flip-chip bonder, leading an N electrode of the LED from the metal electrode formed on the face surface of the silicon chip, and leading a P electrode of the LED from the back side of the heat sink of the housing.

Preferably, the substrate is thinned to a thickness of 80 m-120 m.

Preferably, the number of the back holes is one or more, and the material filled in the back hole(s) is copper.

Preferably, the metal electrode is made of aluminum, chromium, nickel, gold, titanium.

Preferably, the size of the die is 1 mm*1 mm.

BRIEF DESCRIPTION OF THE DRAWINGS

To further illustrate the present invention, the invention is described in more details in conjunction with the accompanying drawings, in which.

DETAILED DESCRIPTION OF PREFERRED EMBODIMENTS

Referring to FIGS. 1, 2, 3 and 4, a method for manufacturing a gallium nitride based LED according to the present invention comprises following steps.

Figure 1:
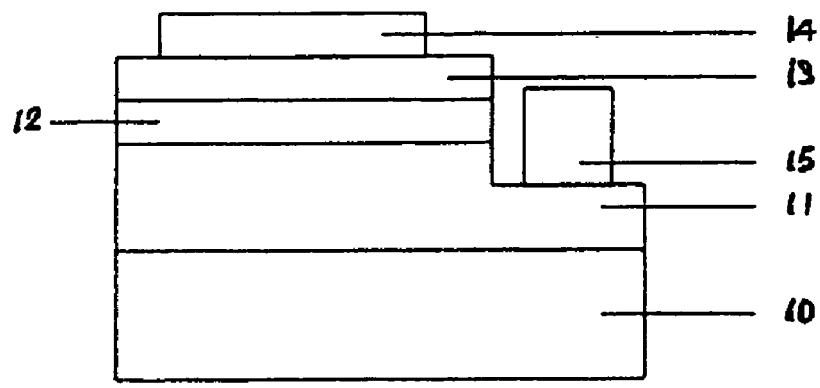
FIG. 1 is a cross section view of the die structure of the GaN based LED according to the present invention.
Figure 2:
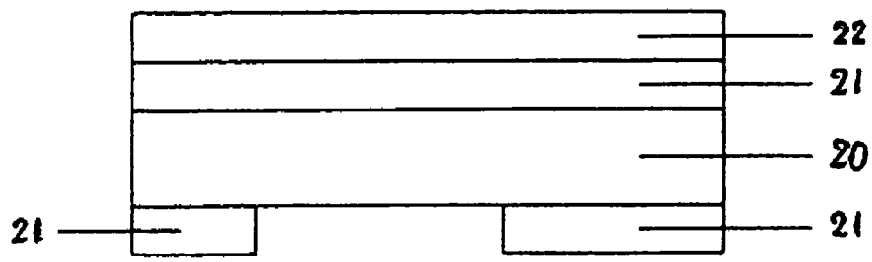
FIG. 2 is a cross section view of the base before the back hole is formed according to the present invention.
Figure 3:
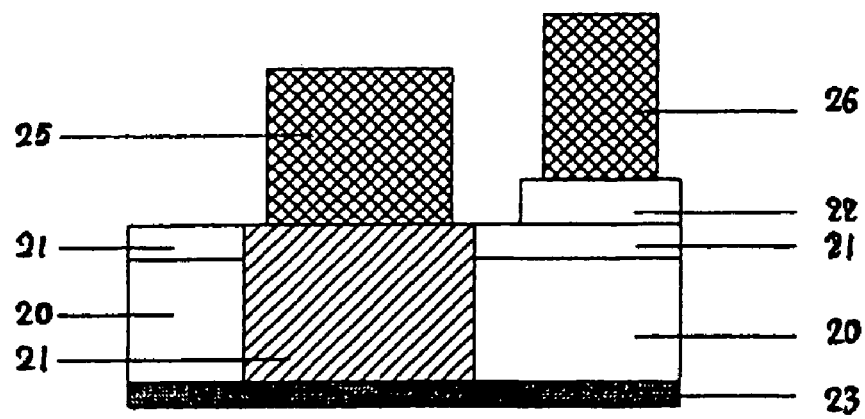
FIG. 3 is a cross section view of the base after the back hole is formed according to the present invention.
Figure 4:
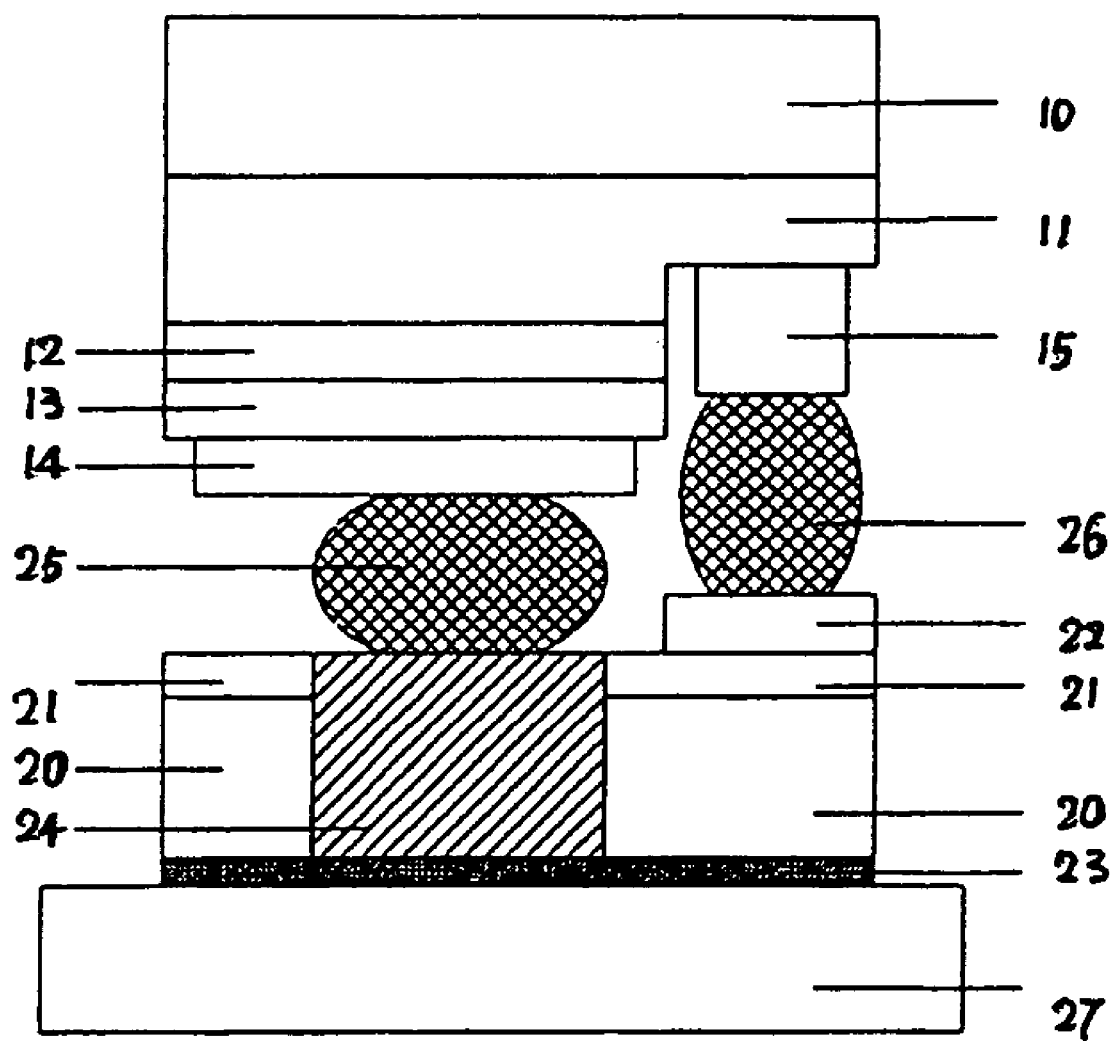
FIG. 4 is a cross section of the final GaN based LED of a back hole structure according to the present invention.

Step 1: epitaxially growing an N type gallium nitride layer 11, a multi-quantum wells emitting active region 12 and a P type gallium nitride layer 13 in turn on an insulation substrate 10 made of sapphire or other materials by using MOCVD method (FIG. 1);

Step 2: etching a designed chip pattern into the N type GaN layer 11 by photoetching, and forming a P type ohmic contact electrode 14 and an N type ohmic contact electrode 15 on the P type GaN layer 13 and N type GaN layer 11, respectively (FIG. 1);

Step 3: thinning the sapphire substrate 10 from its back side to 80 m-120 m, by using a milling method or an ion thinning technique;

Step 4: scribing the chip to divide the dies on the epitaxial chip into individual die, sized 1 mm*1 mm;

Step 5: forming a $SiO_2$ insulation layer 21 on both sides of the silicon chip 20 by a thermal oxidation method, forming a metal electrode 22 on a face side of the silicon chip 20 by evaporation or sputtering, and forming a back hole pattern on a back side by photoetching, then corroding the $SiO_2$; wherein the metal electrode 22 is made of aluminum, chromium, nickel, gold, titanium (FIG. 2);

Step 6: etching or corroding the silicon chip on the back side by ICP dry etching or anisotropic corrosion solution of silicon such as KOH, until the $SiO_2$ insulation isolation layer 21 on the face side being exposed; continuing the corrosion by HF as corrosion solution of silicon oxide, until the metal electrode 22 being exposed, forming a back hole, wherein the number of the back holes is one or more, and the metal material filled in the back hole(s) is copper;

Step 7: plating copper 24 with high heat conductivity in the back hole until the surface thereof and the surface of the back side of the silicon chip are in a plane;

Step 8: forming an electrode 22 connected to the N electrode 15 of the die by photoetching on the face side of the silicon chip 20 (FIG. 2);

Step 9: forming a bump pattern for plating on the face side of the silicon chip 20 by thick resist photoetching, selectively plating metal bumps 25, 26 respectively connected to the P type ohmic contact electrode 14 and the N type ohmic contact electrode 15 (FIG. 3);

Step 10: forming a layer of alloy 23 with low melting point on the back side of the silicon chip 20, thus forming a base (FIG. 3);

Step 11: directly attaching the base to a heat sink 27 of a housing by heating the alloy 23 on the back side of the base (FIG. 4);

Step 12: bonding the die with the face side of the base through metal bumps 25, 26 by a flip-chip bonder, leading an N electrode of the LED from the metal electrode 22 formed on the face surface of the silicon chip 20, and leading a P electrode of the LED from the back side of the heat sink 27 of the housing (FIG. 4).

EMBODIMENT

As shown in FIG. 1, it shows a cross section view of a die of a GaN based LED, the manufacturing process of which is as following. A GaN N type contact layer 11, an emitting active region 12 and a P type GaN contact layer 13 are epitaxially grown on a sapphire substrate 10 by using MOCVD. The shape of the die is designed to be square with a size of 1 mm*1 mm, and then an N type plane (an N type contact layer 11) is formed according to a designed die pattern by ICP system dry etching. Ni/Au/Ag/Ni/Au (50 Å/50 Å/1500 Å/200 Å/1200 Å) are formed on the P type GaN contact layer 13 by electron beam evaporation (or sputtering), and are annealed for 5 minutes at 500° C., forming a P type GaN ohimc contact electrode 14 with low ohimc contact and high reflectivity. Ti/Al/Ni/Au (1500 Å/2200 Å/400 Å/500 Å) are formed on the N type GaN layer 11 by electron beam evaporation (or sputtering), and are annealed for 30 seconds at 900° C., forming an N type GaN ohmic contact electrode 15 with low ohmic contact. The sapphire substrate is thinned from the back side to 80-120 m by milling. The die on the epitaxial layer is divided along the designed scribing lines of the die into individual die of 1 mm*1 mm by a laser scribing technique.

FIG. 2 and FIG. 3 show a cross section view of the base before and after the back hole is formed, respectively. As shown in FIG. 2, the silicon chip 20 is milled to be thinner than 150 m, and is polished on both sides, then $SiO_2$ insulation layers 21 are grown on the both sides to a thickness of 0.8 m by thermal oxidation, and a Cr/Au (500 Å/4000 Å) electrode 22 is formed on a face side by electron beam evaporation (or sputtering). A back hole pattern is photoetched on the back side, and the silicon oxide is corroded. As shown in FIG. 3, the silicon chip 20 is etched (or corroded) from the back side using an ICP system dry etching (or anisotropic corrosion solution of silicon such as KOH), until the silicon oxide 21 on the face side is exposed. The corrosion is continued by using corrosion solution of silicon oxide such as HF, until the metal electrode 22 on the face side is exposed. Copper 24, which is an excellent heat conductor, is plated in the silicon back hole, until the surface thereof and the silicon surface on the back side are in a plane. The electrode 22 connected to the N electrode of the die is formed on the face side of the silicon chip 20 by photoetching. The bump pattern to be used in the plating is formed on the face side of the silicon chip 20 by thick resist photoetching, and at the same time, a metal bump 25 connected to the P electrode of the die and a metal bump 26 connected to the N electrode of the die are formed by selectively plating. Finally, the silicon oxide remained on the back side is remove by wet corrosion, and an Au/Sn alloy 23 with low melting point is formed on the back side of the silicon chip by evaporation (or sputtering), forming a base.

As shown in FIG. 4, the individual die which has been divided and the base are aligned using the flip-chip bonding equipment, and are reflow-soldered together by heating the bumps, and a gold filament is led from the metal electrode 22 on the face side of the silicon chip as an N electrode of the entire LED by ultrasonic pressure bonding. The base is directly attached to a heat sink 27 of a housing by heating the alloy 23, and a P electrode of the entire LED is led from the back side of the heat sink 27 of the housing. Thus, a GaN based LED of a back hole structure is completed with a complete structure and a good performance.

The present invention provides a method for manufacturing a GaN based LED of a back hole structure, wherein the whole heat conducting path is metals, which are excellent heat conductors. This new method reduces the thermal resistance as much as possible, and realizes the heat dissipation with a so-called sub-zero thermal resistance, and is also completely compatible with the normal flip-chip LED manufacturing processes. Compared with conventional LEDs, the heat dissipation structure of the devices is optimized, enabling the LED to operate continuously for long time at a larger operating current, and improving the performance and reliability of the LEDs, and facilitating the realization of power type LEDs for illumination.

The invention claimed is:

1. A method for manufacturing a gallium nitride based lighting emitting diode of a back hole structure comprising steps of:

Step 1: epitaxially growing an N type gallium nitride (GaN) layer, a multi-quantum wells emitting active region and a P type gallium nitride layer in turn on an insulation substrate made of sapphire or other materials by a metal organic chemical vapor deposition (MOCVD) method;

Step 2: etching a designed chip pattern into the N type GaN layer by photoetching, and forming a P type ohmic contact electrode and an N type ohmic contact electrode on the P type GaN layer and N type GaN layer, respectively;

Step 3: thinning the sapphire substrate from its back side by a milling method or an ion thinning technique;

Step 4: scribing the chip to divide the dies on the epitaxial chip into individual die;

Step 5: forming a $SiO_2$ insulation isolation layer on both sides of the silicon chip by a thermal oxidation method, forming a metal electrode on a face side by evaporation or sputtering, and forming a back hole pattern on a back side by photoetching, then corroding the $SiO_2$;

Step 6: etching or corroding the silicon chip on the back side by ICP dry etching or KOH as anisotropic corrosion solution of silicon, until the $SiO_2$ insulation isolation layer on the face side being exposed; continuing the corrosion by HF as corrosion solution of silicon oxide, until the metal electrode being exposed, thus forming a back hole;

Step 7: plating copper with high heat conductivity in the back hole until the surface thereof and the surface of the back side of the silicon chip are in a plane;

Step 8: forming an electrode connected to the N electrode of the die by photoetching on the face side of the silicon chip;

Step 9: forming a bump pattern for plating on the face side of the silicon chip by thick resist photoetching, selectively plating metal bumps respectively connected to the P type ohmic contact electrode and the N type ohmic contact electrode of the die;

Step 10: forming a layer of alloy with low melting point on the back side of the silicon chip, thus forming a base;

Step 11: directly attaching the base to a heat sink of a housing by heating the alloy on the back side of the base;

Step 12: bonding the die with the face side of the base through the metal bumps by a flip-chip bonder, leading an N electrode of the LED from the metal electrode formed on the face surface of the silicon chip, and leading a P electrode of the LED from the back side of the heat sink of the housing.

2. The method according to claim 1, wherein the substrate is thinned to a thickness of 80 m-120 m.

3. The method according to claim 1, wherein the number of the back holes is one or more, and the material filled in the back hole(s) is copper.

4. The method according to claim 1, wherein the metal electrode is made of aluminum, chromium, nickel, gold, titanium.

5. The method according to claim 1, wherein the size of the die is 1 mm*1 mm.

* * * * *